United States Patent
Kuo et al.

(10) Patent No.: US 11,145,560 B2
(45) Date of Patent: Oct. 12, 2021

(54) SEMICONDUCTOR DEVICE AND METHODS OF MANUFACTURING

(71) Applicant: Taiwan Semiconductor Manufacturing Company, Ltd., Hsinchu (TW)

(72) Inventors: Hung-Jui Kuo, Hsinchu (TW); Hsing-Chieh Lee, Hsinchu (TW); Ming-Tan Lee, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 228 days.

(21) Appl. No.: 16/398,542

(22) Filed: Apr. 30, 2019

(65) Prior Publication Data

US 2020/0350218 A1   Nov. 5, 2020

(51) Int. Cl.
*H01L 21/66* (2006.01)
*H01L 21/027* (2006.01)
(Continued)

(52) U.S. Cl.
CPC ............ *H01L 22/24* (2013.01); *G03F 7/0045* (2013.01); *G03F 7/0392* (2013.01); *G03F 7/38* (2013.01); *H01L 21/0275* (2013.01); *H01L 21/561* (2013.01); *H01L 21/563* (2013.01); *H01L 21/565* (2013.01); *H01L 21/76898* (2013.01); *H01L 23/3128* (2013.01); *H01L 23/481* (2013.01); *H01L 23/5226* (2013.01);
(Continued)

(58) Field of Classification Search
CPC ....... H01L 2221/68381; H01L 21/6835; H01L 22/12; H01L 21/0274; H01L 2224/0231; H01L 2224/02379; H01L 2224/02381; H01L 2224/02373; H01L 2221/68331; H01L 21/6836; H01L 2221/68345; H01L 21/568; H01L 21/56; H01L 2221/68359; H01L 2221/68372; H01L 22/24; H01L 21/76898; H01L 24/97; H01L 24/09; H01L 24/17; H01L 24/49; H01L 24/73; H01L 21/561; H01L 21/563; H01L 21/565; H01L 23/3128; H01L 23/481; H01L 23/5226; H01L 23/5283; H01L 25/0657; H01L 21/0275; H01L 2224/73257; G03F 7/70625; G03F 7/70608; G03F 7/039; G03F 7/40; G03F 7/105; G03F 7/004; G03F 7/38; G03F 7/0045; G03F 7/0392

USPC .......................................................... 430/30
See application file for complete search history.

(56) References Cited

U.S. PATENT DOCUMENTS 6,335,531 B1 * 1/2002 Somerville ............... G03F 7/40
250/458.1
8,361,842 B2   1/2013 Yu et al.
(Continued)

FOREIGN PATENT DOCUMENTS

CN           104391428     *  3/2015

*Primary Examiner* — Caleen O Sullivan
(74) *Attorney, Agent, or Firm* — Slater Matsil, LLP

(57) ABSTRACT

A photoresist with a detection additive is utilized to help increase the contrast of images during an after development inspection process. The detection additive fluoresces during the after development inspection process and adds to the energy that is reflected during the after development inspection process, increasing the contrast during the after development inspection process and helping to identify defects that are not otherwise detectable.

20 Claims, 12 Drawing Sheets

(51) Int. Cl.
  *H01L 21/768*  (2006.01)
  *H01L 21/56*   (2006.01)
  *H01L 23/00*   (2006.01)
  *H01L 23/31*   (2006.01)
  *H01L 23/48*   (2006.01)
  *H01L 23/522*  (2006.01)
  *H01L 23/528*  (2006.01)
  *H01L 25/065*  (2006.01)
  *G03F 7/38*    (2006.01)
  *G03F 7/004*   (2006.01)
  *G03F 7/039*   (2006.01)

(52) U.S. Cl.
  CPC .......... *H01L 23/5283* (2013.01); *H01L 24/09* (2013.01); *H01L 24/17* (2013.01); *H01L 24/49* (2013.01); *H01L 24/73* (2013.01); *H01L 24/97* (2013.01); *H01L 25/0657* (2013.01); *H01L 2224/0231* (2013.01); *H01L 2224/02373* (2013.01); *H01L 2224/02379* (2013.01); *H01L 2224/02381* (2013.01); *H01L 2224/73257* (2013.01)

(56) References Cited

U.S. PATENT DOCUMENTS

| | | |
|---|---|---|
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2011/0291288 A1 | 12/2011 | Wu et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2017/0103924 A1* | 4/2017 | Park .................... G01N 21/00 |
| 2019/0339613 A1* | 11/2019 | Golden .................. G03F 7/038 |

* cited by examiner

SEMICONDUCTOR DEVICE AND METHODS OF MANUFACTURING

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
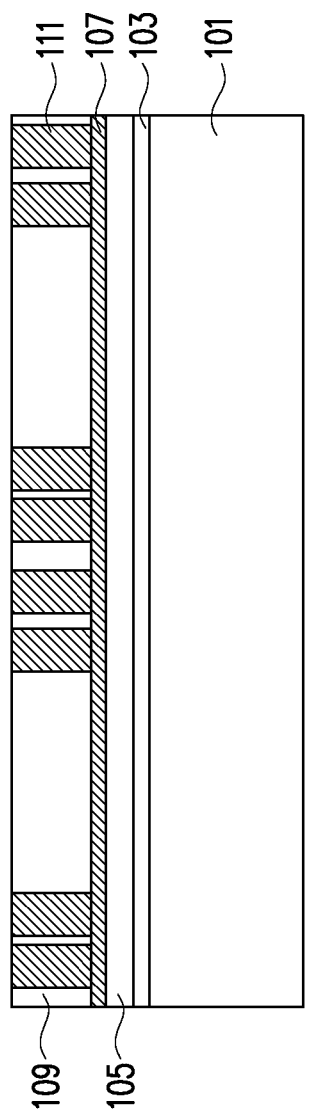
FIG. 1 illustrates formation of through vias, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described in which a detection additive is utilized within a photoresist in order to increase the contrast of a subsequent after development inspection process. The embodiments described herein are described with respect to technology nodes less than 20 nm, such as 7 nm. However, the embodiments are not limited to these process nodes, and may be used in a wide variety of applications.

With reference now to FIG. 1, there is shown a carrier substrate 101 with an adhesive layer 103, a polymer layer 105, and a first seed layer 107 over the carrier substrate 101. The carrier substrate 101 comprises, for example, silicon based materials, such as glass or silicon oxide, or other materials, such as aluminum oxide, combinations of any of these materials, or the like. The carrier substrate 101 is planar in order to accommodate an attachment of semiconductor devices such as a first semiconductor device 201 and a second semiconductor device 301 (not illustrated in FIG. 1 but illustrated and discussed below with respect to FIGS. 2-3).

The adhesive layer 103 is placed on the carrier substrate 101 in order to assist in the adherence of overlying structures (e.g., the polymer layer 105). In an embodiment the adhesive layer 103 may comprise an ultra-violet glue, which loses its adhesive properties when exposed to ultra-violet light. However, other types of adhesives, such as pressure sensitive adhesives, radiation curable adhesives, epoxies, combinations of these, or the like, may also be used. The adhesive layer 103 may be placed onto the carrier substrate 101 in a semi-liquid or gel form, which is readily deformable under pressure.

The polymer layer 105 is placed over the adhesive layer 103 and is utilized in order to provide protection to, e.g., the first semiconductor device 201 and the second semiconductor device 301 once the first semiconductor device 201 and the second semiconductor device 301 have been attached. In an embodiment the polymer layer 105 may be polybenzoxazole (PBO), although any suitable material, such as polyimide or a polyimide derivative, Solder Resistance (SR), or Ajinomoto build-up film (ABF) may be utilized. The polymer layer 105 may be placed using, e.g., a spin-coating process to a thickness of between about 2 μm and about 15 μm, such as about 5 μm, although any suitable method and thickness may be used.

The first seed layer 107 is formed over the polymer layer 105. In an embodiment the first seed layer 107 is a thin layer of a conductive material that aids in the formation of a thicker layer during subsequent processing steps. The first seed layer 107 may comprise a layer of titanium about 1,000 Å thick followed by a layer of copper about 5,000 Å thick. The first seed layer 107 may be created using processes such as sputtering, evaporation, or PECVD processes, depending upon the desired materials. The first seed layer 107 may be formed to have a thickness of between about 0.3 μm and about 1 μm, such as about 0.5 μm.

FIG. 1 also illustrates a placement and patterning of a photoresist 109 over the first seed layer 107. In an embodiment the photoresist 109 may be placed on the first seed layer 107 using, e.g., a spin coating technique to a height of between about 50 μm and about 250 μm, such as about 120 μm. Once in place, the photoresist 109 may then be patterned by exposing the photoresist 109 to a patterned energy source (e.g., a patterned light source) so as to induce a chemical reaction, thereby inducing a physical change in those portions of the photoresist 109 exposed to the patterned light source. A developer is then applied to the exposed photoresist 109 to take advantage of the physical changes and selectively remove either the exposed portion of the photoresist 109 or the unexposed portion of the photoresist 109, depending upon the desired pattern.

In an embodiment the pattern formed into the photoresist 109 is a pattern for vias 111, also known as through vias, through substrate vias, through insulator vias, or through InFO vias. The vias 111 are formed in such a placement as to be located on different sides of subsequently attached devices such as the first semiconductor device 201 and the second semiconductor device 301. However, any suitable arrangement for the pattern of vias 111, such as by being located such that the first semiconductor device 201 and the second semiconductor device 301 are placed on opposing sides of the vias 111, may be utilized.

In an embodiment the vias 111 are formed within the photoresist 109. In an embodiment the vias 111 comprise one or more conductive materials, such as copper, tungsten, other conductive metals, or the like, and may be formed, for example, by electroplating, electroless plating, or the like. In an embodiment, an electroplating process is used wherein the first seed layer 107 and the photoresist 109 are submerged or immersed in an electroplating solution. The first seed layer 107 surface is electrically connected to the negative side of an external DC power supply such that the first seed layer 107 functions as the cathode in the electroplating process. A solid conductive anode, such as a copper anode, is also immersed in the solution and is attached to the positive side of the power supply. The atoms from the anode are dissolved into the solution, from which the cathode, e.g., the first seed layer 107, acquires the dissolved atoms, thereby plating the exposed conductive areas of the first seed layer 107 within the opening of the photoresist 109.

Once the vias 111 have been formed using the photoresist 109 and the first seed layer 107, the photoresist 109 may be removed using a suitable removal process (not illustrated in FIG. 1 but seen in FIG. 3 below). In an embodiment, a plasma ashing process may be used to remove the photoresist 109, whereby the temperature of the photoresist 109 may be increased until the photoresist 109 experiences a thermal decomposition and may be removed. However, any other suitable process, such as a wet strip, may be utilized. The removal of the photoresist 109 may expose the underlying portions of the first seed layer 107.

Once exposed a removal of the exposed portions of the first seed layer 107 may be performed (not illustrated in FIG. 1 but seen in FIG. 3 below). In an embodiment the exposed portions of the first seed layer 107 (e.g., those portions that are not covered by the vias 111) may be removed by, for example, a wet or dry etching process. For example, in a dry etching process reactants may be directed towards the first seed layer 107 using the vias 111 as masks. In another embodiment, etchants may be sprayed or otherwise put into contact with the first seed layer 107 in order to remove the exposed portions of the first seed layer 107. After the exposed portion of the first seed layer 107 has been etched away, a portion of the polymer layer 105 is exposed between the vias 111.

Figure 2:
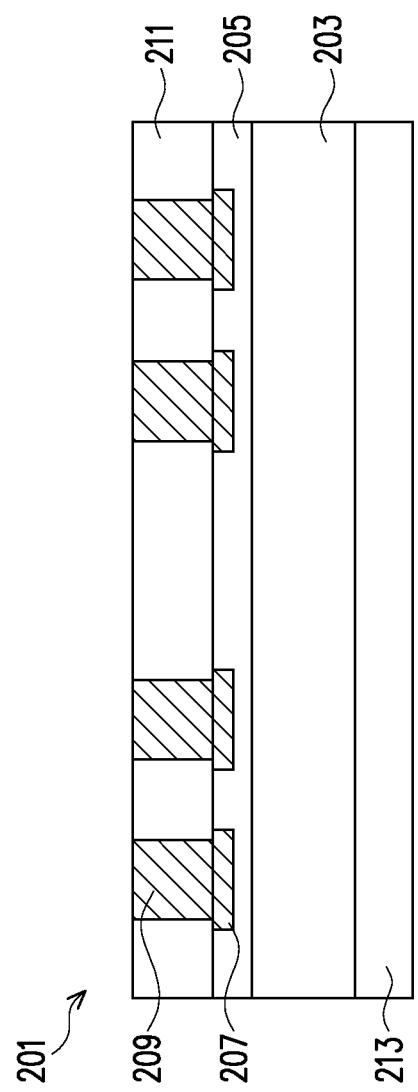
FIG. 2 illustrates a semiconductor device, in accordance with some embodiments.

FIG. 2 illustrates a first semiconductor device 201 that will be attached to the polymer layer 105 within the vias 111 (not illustrated in FIG. 2 but illustrated and described below with respect to FIG. 3). In an embodiment the first semiconductor device 201 comprises a first substrate 203, first active devices (not individually illustrated), first metallization layers 205, first contact pads 207, a first passivation layer 211, and first external connectors 209. The first substrate 203 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices comprise a wide variety of active devices and passive devices such as capacitors, resistors, inductors and the like that may be used to generate the desired structural and functional desires of the design for the first semiconductor device 201. The first active devices may be formed using any suitable methods either within or else on the first substrate 203.

The first metallization layers 205 are formed over the first substrate 203 and the first active devices and are designed to connect the various active devices to form functional circuitry. In an embodiment the first metallization layers 205 are formed of alternating layers of dielectric and conductive material and may be formed through any suitable process (such as deposition, damascene, dual damascene, etc.). In an embodiment there may be four layers of metallization separated from the first substrate 203 by at least one interlayer dielectric layer (ILD), but the precise number of first metallization layers 205 is dependent upon the design of the first semiconductor device 201.

The first contact pads 207 may be formed over and in electrical contact with the first metallization layers 205. The first contact pads 207 may comprise aluminum, but other materials, such as copper, may be used. The first contact pads 207 may be formed using a deposition process, such as sputtering, to form a layer of material (not shown) and portions of the layer of material may then be removed through a suitable process (such as photolithographic masking and etching) to form the first contact pads 207. However, any other suitable process may be utilized to form the first contact pads 207. The first contact pads 207 may be formed to have a thickness of between about 0.5 μm and about 4 μm, such as about 1.45 μm.

The first passivation layer 211 may be formed on the first substrate 203 over the first metallization layers 205 and the first contact pads 207. The first passivation layer 211 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 211 may be formed through a process such as chemical vapor deposition (CVD), although any suitable process may be utilized, and may have a thickness between about 0.5 μm and about 5 μm, such as about 9.25 K Å.

The first external connectors 209 may be formed to provide conductive regions for contact between the first contact pads 207 and, e.g., a first redistribution layer 501 (not illustrated in FIG. 2 but illustrated and described below with respect to FIG. 5). In an embodiment the first external connectors 209 may be conductive pillars and may be formed by initially forming a photoresist (not shown) over the first passivation layer 211 to a thickness between about 5 μm to about 20 μm, such as about 10 μm. The photoresist may be patterned to expose portions of the first passivation layers through which the conductive pillars will extend. Once patterned, the photoresist may then be used as a mask to remove the desired portions of the first passivation layer 211, thereby exposing those portions of the underlying first contact pads 207 to which the first external connectors 209 will make contact.

The first external connectors 209 may be formed within the openings of both the first passivation layer 211 and the photoresist. The first external connectors 209 may be formed from a conductive material such as copper, although other conductive materials such as nickel, gold, or metal alloy, combinations of these, or the like may also be used. Additionally, the first external connectors 209 may be formed using a process such as electroplating, by which an electric current is run through the conductive portions of the first contact pads 207 to which the first external connectors 209 are desired to be formed, and the first contact pads 207 are immersed in a solution. The solution and the electric current deposit, e.g., copper, within the openings in order to fill and/or overfill the openings of the photoresist and the first passivation layer 211, thereby forming the first external connectors 209. Excess conductive material and photoresist outside of the openings of the first passivation layer 211 may then be removed using, for example, an ashing process, a chemical mechanical polish (CMP) process, combinations of these, or the like.

However, as one of ordinary skill in the art will recognize, the above described process to form the first external connectors 209 is merely one such description, and is not meant to limit the embodiments to this exact process. Rather, the described process is intended to be merely illustrative, as any suitable process for forming the first external connectors 209 may be utilized. All suitable processes are fully intended to be included within the scope of the present embodiments.

On an opposite side of the first substrate 203 than the first metallization layers 205, a die attach film (DAF) 213 may be formed in order to assist in the attachment of the first semiconductor device 201 to the polymer layer 105. In an embodiment the die attach film 213 is an epoxy resin, a phenol resin, acrylic rubber, silica filler, or a combination thereof, and is applied using a lamination technique. However, any other suitable material and method of formation may be utilized.

Figure 3:
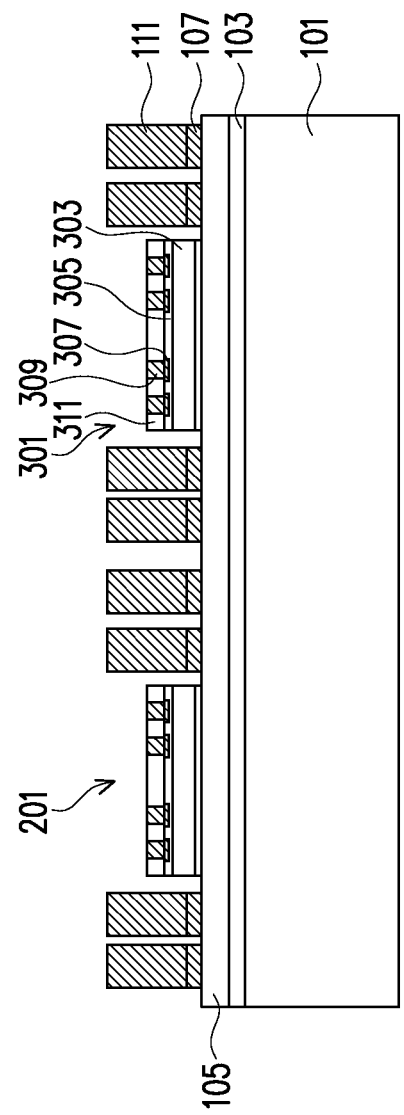
FIG. 3 illustrates placement of the semiconductor device with the through vias, in accordance with some embodiments.

FIG. 3 illustrates a placement of the first semiconductor device 201 onto the polymer layer 105 along with a placement of a second semiconductor device 301. In an embodiment the second semiconductor device 301 may comprise a second substrate 303, second active devices (not individually illustrated), second metallization layers 305, second contact pads 307, a second passivation layer 311, and second external connectors 309. In an embodiment the second substrate 303, the second active devices, the second metallization layers 305, the second contact pads 307, the second passivation layer 311, and the second external connectors 309 may be similar to the first substrate 203, the first active devices, the first metallization layers 205, the first contact pads 207, the first passivation layer 211, and the first external connectors 209, although they may also be different.

In an embodiment the first semiconductor device 201 and the second semiconductor device 301 may be placed onto the polymer layer 105 using, e.g., a pick and place process. However, any other method of placing the first semiconductor device 201 and the second semiconductor device 301.

Figure 4:
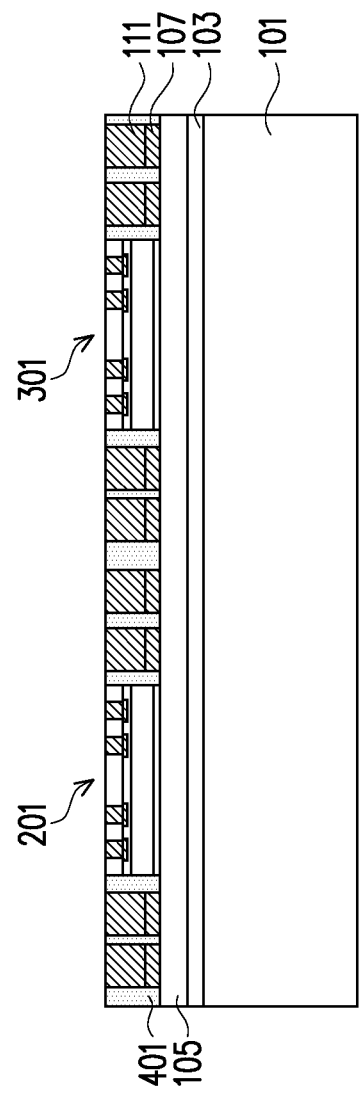
FIG. 4 illustrates an encapsulation, in accordance with some embodiments.

FIG. 4 illustrates an encapsulation of the vias 111, the first semiconductor device 201 and the second semiconductor device 301. The encapsulation may be performed in a molding device (not individually illustrated in FIG. 4), which may comprise a top molding portion and a bottom molding portion separable from the top molding portion. When the top molding portion is lowered to be adjacent to the bottom molding portion, a molding cavity may be formed for the carrier substrate 101, the vias 111, the first semiconductor device 201, and the second semiconductor device 301.

During the encapsulation process the top molding portion may be placed adjacent to the bottom molding portion, thereby enclosing the carrier substrate 101, the vias 111, the first semiconductor device 201, and the second semiconductor device 301 within the molding cavity. Once enclosed, the top molding portion and the bottom molding portion may form an airtight seal in order to control the influx and outflux of gasses from the molding cavity. Once sealed, an encapsulant 401 may be placed within the molding cavity. The encapsulant 401 may be a molding compound resin such as polyimide, PPS, PEEK, PES, a heat resistant crystal resin, combinations of these, or the like. The encapsulant 401 may be placed within the molding cavity prior to the alignment of the top molding portion and the bottom molding portion, or else may be injected into the molding cavity through an injection port.

Once the encapsulant 401 has been placed into the molding cavity such that the encapsulant 401 encapsulates the carrier substrate 101, the vias 111, the first semiconductor device 201, and the second semiconductor device 301, the encapsulant 401 may be cured in order to harden the encapsulant 401 for optimum protection. While the exact curing process is dependent at least in part on the particular material chosen for the encapsulant 401, in an embodiment in which molding compound is chosen as the encapsulant 401, the curing could occur through a process such as heating the encapsulant 401 to between about 100° C. and about 130° C., such as about 125° C. for about 60 sec to about 3000 sec, such as about 600 sec. Additionally, initiators and/or catalysts may be included within the encapsulant 401 to better control the curing process.

However, as one having ordinary skill in the art will recognize, the curing process described above is merely an exemplary process and is not meant to limit the current embodiments. Other curing processes, such as irradiation or even allowing the encapsulant 401 to harden at ambient temperature, may be used. Any suitable curing process may be used, and all such processes are fully intended to be included within the scope of the embodiments discussed herein.

FIG. 4 also illustrates a thinning of the encapsulant 401 in order to expose the vias 111, the first semiconductor device 201, and the second semiconductor device 301 for further processing. The thinning may be performed, e.g., using a mechanical grinding or chemical mechanical polishing (CMP) process whereby chemical etchants and abrasives are utilized to react and grind away the encapsulant 401, the first semiconductor device 201 and the second semiconductor device 301 until the vias 111, the first external connectors 209 (on the first semiconductor device 201), and the second external connectors 309 (on the second semiconductor device 301) have been exposed. As such, the first semiconductor device 201, the second semiconductor device 301, and the vias 111 may have a planar surface that is also coplanar with the encapsulant 401.

However, while the CMP process described above is presented as one illustrative embodiment, it is not intended to be limiting to the embodiments. Any other suitable removal process may be used to thin the encapsulant 401, the first semiconductor device 201, and the second semiconductor device 301 and expose the vias 111. For example, a series of chemical etches may be utilized. This process and any other suitable process may be utilized to thin the encapsulant 401, the first semiconductor device 201, and the second semiconductor device 301, and all such processes are fully intended to be included within the scope of the embodiments.

Optionally, after the encapsulant 401 has been thinned, the vias 111, the first external connectors 209, and the second external connectors 309 may be recessed within the encapsulant 401. In an embodiment the vias 111, the first external connectors 209, and the second external connectors 309 may be recessed using, e.g., an etching process that utilizes an etchant that is selective to the material of the vias 111, the first external connectors 209, and the second external connectors 309 (e.g., copper). The vias 111, the first external connectors 209, and the second external connectors 309 may be recessed to a depth of between about 20 µm and about 300 µm, such as about 180 µm.

Figure 5:
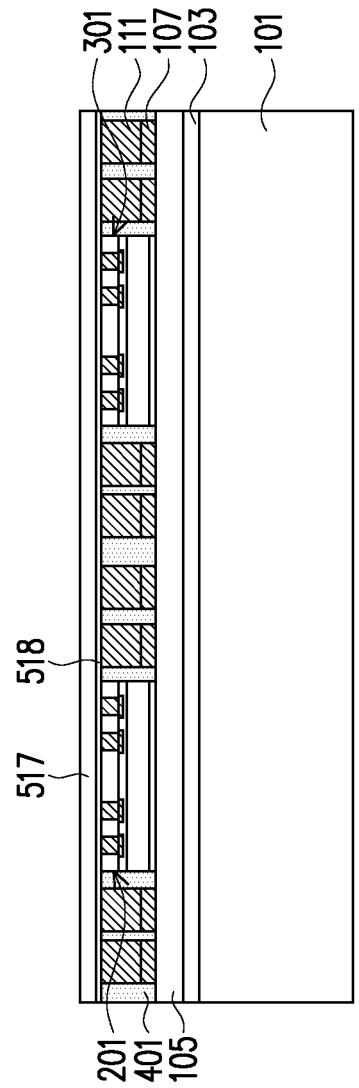
FIG. 5 illustrates placement of a photoresist, in accordance with some embodiments.

FIG. 5 illustrates cross-sectional views of a starting process for a formation of a first redistribution layer (RDL) 501. In an embodiment the first redistribution layer 501 may be formed by initially forming a seed layer 518 of a titanium copper alloy through a suitable formation process such as CVD or sputtering. Once the seed layer 518 has been deposited, a photoresist 517 may be placed onto the seed layer 518 to prepare for a formation of the first RDL 501. In an embodiment the photoresist 517 may be a chemically amplified photoresist and includes a photoresist polymer resin along with one or more photoactive compounds (PACs) in a photoresist solvent. In an embodiment the photoresist polymer resin may comprise a hydrocarbon structure (such as an alicyclic hydrocarbon structure) that contains one or more groups that will decompose (e.g., an acid labile group) or otherwise react when mixed with acids, bases, or free radicals generated by the PACs (as further described below with respect to FIG. 6). In an embodiment the hydrocarbon structure comprises a repeating unit that forms a skeletal backbone of the photoresist polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

Specific structures which may be utilized for the repeating unit of the hydrocarbon structure include methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth) acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy)ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate and the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether and the like. Examples of the styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In an embodiment the repeating unit of the hydrocarbon structure may also have either a monocyclic or a polycyclic hydrocarbon structure substituted into it, or else the monocyclic or polycyclic hydrocarbon structure may be the repeating unit, in order to form an alicyclic hydrocarbon structure. Specific examples of monocyclic structures that may be used include bicycloalkane, tricycloalkane, tetracycloalkane, cyclopentane, cyclohexane, or the like. Specific examples of polycyclic structures that may be used include adamantine, norbornane, isobornane, tricyclodecane, tetracycododecane, or the like.

The group which will decompose, otherwise known as a leaving group or, in an embodiment in which the PAC is a photoacid generator, an acid labile group, is attached to the hydrocarbon structure so that it will react with the acids/bases/free radicals generated by the PACs during exposure. In an embodiment the group which will decompose may be a carboxylic acid group, a fluorinated alcohol group, a phenolic alcohol group, a sulfonic group, a sulfonamide group, a sulfonylimido group, an (alkylsulfonyl) (alkylcarbonyl)methylene group, an (alkylsulfonyl)(alkyl-carbonyl) imido group, a bis(alkylcarbonyl)methylene group, a bis(alkylcarbonyl)imido group, a bis(alkylsylfonyl)methylene group, a bis(alkylsulfonyl)imido group, a tris(alkylcarbonyl methylene group, a tris(alkylsylfonyl)methylene group, combinations of these, or the like. Specific groups that may be utilized for the fluorinated alcohol group include fluorinated hydroxyalkyl groups, such as a hexafluoroisopropanol group. Specific groups that may be utilized for the carboxylic acid group include acrylic acid groups, methacrylic acid groups, or the like.

In an embodiment the photoresist polymer resin may also comprise other groups attached to the hydrocarbon structure that help to improve a variety of properties of the polymerizable resin. For example, inclusion of a lactone group to the hydrocarbon structure assists to reduce the amount of line edge roughness after the photoresist 517 has been developed, thereby helping to reduce the number of defects that occur during development. In an embodiment the lactone groups may include rings having five to seven members, although any suitable lactone structure may be used for the lactone group.

The photoresist polymer resin may also comprise groups that can assist in increasing the adhesiveness of the photoresist 517 to underlying structures. In an embodiment polar groups may be used to help increase the adhesiveness, and polar groups that may be used in this embodiment include hydroxyl groups, cyano groups, or the like, although any suitable polar group may be utilized.

Optionally, the photoresist polymer resin may further comprise one or more alicyclic hydrocarbon structures that do not also contain a group which will decompose. In an embodiment the hydrocarbon structure that does not contain a group which will decompose may include structures such as 1-adamantyl(meth)acrylate, tricyclodecanyl (meth)acrylate, cyclohexayl (methacrylate), combinations of these, or the like.

Additionally, the photoresist 517 also comprises one or more PACs. The PACs may be photoactive components such as photoacid generators, photobase generators, free-radical generators, or the like. In an embodiment in which the PACs are a photoacid generator, the PACs may comprise halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like. In a particular embodiment the photoacid generator have the following formula:

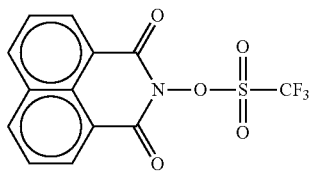

However, any suitable photoacid generator may be utilized.

Specific examples of photoacid generators that may be used include α.-(trifluoromethylsulfonyloxy)-bicyclo[2.2.1] hept-5-ene-2,3-dicarbo-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl) triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, and the like.

In an embodiment in which the PACs are a free-radical generator, the PACs may comprise n-phenylglycine, aromatic ketones such as benzophenone, N,N'-tetramethyl-4,4'-diaminobenzophenone, N,N'-tetraethyl-4,4'-diaminobenzo-phenone, 4-methoxy-4'-dimethylaminobenzo-phenone, 3,3'-dimethyl-4-methoxybenzophenone, p,p'-bis (dimethylamino)benzo-phenone, p,p'-bis(diethylamino)-benzophenone, anthraquinone, 2-ethylanthraquinone, naphthaquinone and phenanthraquinone, benzoins such as benzoin, benzoinmethylether, benzoinethylether, benzo-inisopropylether, benzoin-n-butylether, benzoin-phenylether, methylbenzoin and ethybenzoin, benzyl derivatives such as dibenzyl, benzyldiphenyldisulfide and benzyldimethylketal, acridine derivatives such as 9-phenylacridine and 1,7-bis(9-acridinyl)heptane, thioxanthones such as 2-chlorothioxanthone, 2-methylthioxanthone, 2,4-diethylthioxanthone, 2,4-dimethylthioxanthone and 2-isopropylthioxanthone, acetophenones such as 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone, 2,4,5-triarylimidazole dimers such as 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer, suitable combinations of these, or the like.

In an embodiment in which the PACs are a photobase generator, the PACs may comprise quaternary ammonium dithiocarbamates, α aminoketones, oxime-urethane containing molecules such as dibenzophenoneoxime hexamethylene diurethan, ammonium tetraorganylborate salts, and N-(2-nitrobenzyloxycarbonyl) cyclic amines, suitable combinations of these, or the like. However, as one of ordinary skill in the art will recognize, the chemical compounds listed herein are merely intended as illustrated examples of the PACs and are not intended to limit the embodiments to only those PACs specifically described. Rather, any suitable PAC may be utilized, and all such PACs are fully intended to be included within the scope of the present embodiments.

Additionally, the photoresist 517 may also contain a detection additive which helps to increase the ability of an after development inspection (ADI) to detect the presence of defects in the photoresist 517. In some embodiments the detection additive may be a fluorescent additive that, under the conditions that are present during the after development inspection, fluoresces to help the inspection process detect previously unseen defects. For example, the detection additive may be a material which has different excitation and emission bands, which allows the detection additive to absorb light at a first wavelength and then emit light at a second wavelength.

In a particular embodiment the detection additive may be a fluorescent additive that has a highly conjugated structure. For example, in some embodiments the detection additive may be the keto form of curcumin, which may have the following structure:

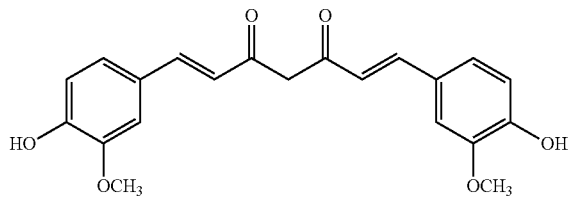 [SMILES: COc1cc(/C=C/C(=O)CC(=O)/C=C/c2ccc(O)c(OC)c2)ccc1O]

With this structure, the curcumin will have an excitation band of about 420 nm, but will also have an emission band of about 540 nm. Because of this difference, the inspection process can also take images which will capture wavelengths at the emission band (e.g., 540 nm), which, together with the other data captured, can be used to provide additional images. These additional images can help provide additional contrast to identify possible defects that are not otherwise detectable.

Additionally, while the keto form of curcumin is described and illustrated above, this is intended to simply be an illustrative example of one possible detection additive and is not intended to limited to this precise embodiment. Rather, any suitable detection additive, such as the enol form of curcumin, or any other chemical which has appropriate excitation and emission bands that help with adding contrast during the after development inspection, may also be utilized. For example, curcumin I, curcumin II (demethoxycurcumin), or curcumin III (bis-demoethoxycurcumin), each of which has a structure as illustrated below, respectively, may also be utilized:

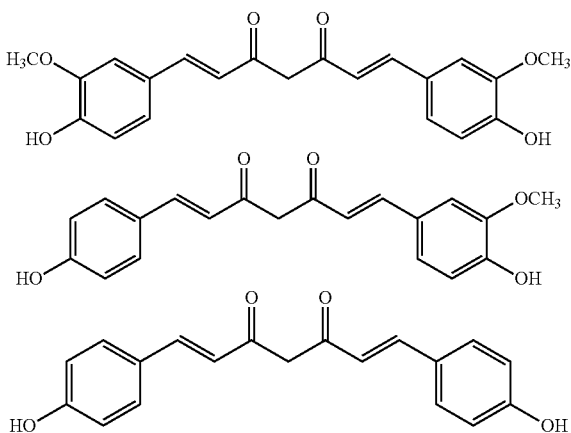

All such detection additives are fully intended to be included within the scope of the embodiments.

The individual components of the photoresist 517 may be placed into the photoresist solvent in order to aid in the mixing and placement of the photoresist 517. To aid in the mixing and placement of the photoresist 517, the photoresist solvent is chosen at least in part based upon the materials chosen for the photoresist polymer resin as well as the PACs. In particular, the photoresist solvent is chosen such that the photoresist polymer resin and the PACs can be evenly dissolved into the photoresist solvent and dispensed.

In an embodiment the photoresist solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the photoresist solvent for the photoresist 517 include, acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol dimethyl ether, ethylene glycol methylethyl ether, ethylene glycol monoetheryl ether, methyl celluslve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, dietherylene glycol monoethyl ether, diethylene glycol monbutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, butyl acetate, methyl lactate and ethyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, proplyelen glycol methyl ether adcetate, proplylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, methyl lactate, ethyl lactate, propyl lactate, and butyl lactate, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, pylene carbonate, vinylene carbonate, ethylene carbonate, and butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylehter, monopheylether, dipropylene glycol mono-acetate, dioxane, methyl lactate, etheyl lactate, methyl acetate, ethyl acetate, butyl acetate, methyl puruvate, ethyl puruvate, propyl pyruvate, methyl methoxypropionate, ethyl ethoxypropionate, n-methylpyrrolidone (NMP), 2-methoxyethyl ether (diglyme), ethylene glycol monom-ethyl ether, propylene glycol monomethyl ether; ethyl lactate or methyl lactate, methyl proponiate, ethyl proponiate and ethyl ethoxy proponiate, methylethyl ketone, cyclohexanone, 2-heptanone, carbon dioxide, cyclopentatone, cyclohexanone, ethyl 3-ethocypropionate, ethyl lactate, propylene glycol methyl ether acetate (PGMEA), methylene cellosolve, butyle acetate, and 2-ethoxyethanol, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, or the like.

However, as one of ordinary skill in the art will recognize, the materials listed and described above as examples of materials that may be utilized for the photoresist solvent component of the photoresist 517 are merely illustrative and are not intended to limit the embodiments. Rather, any suitable material that may dissolve the photoresist polymer resin and the PACs may be utilized to help mix and apply the photoresist 517. All such materials are fully intended to be included within the scope of the embodiments.

Additionally, while individual ones of the above described materials may be used as the photoresist solvent for the photoresist 517, in embodiments more than one of the above described materials may be utilized. For example, the photoresist solvent may comprise a combination mixture of two or more of the materials described. All such combinations are fully intended to be included within the scope of the embodiments.

Optionally, a photoresist cross-linking agent may also be added to the photoresist 517. The photoresist cross-linking agent reacts with the photoresist polymer resin within the photoresist 517 after exposure, assisting in increasing the cross-linking density of the photoresist 517, which helps to improve the resist pattern and resistance to dry etching. In an embodiment the photoresist cross-linking agent may be an melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, combinations of these, or the like.

Specific examples of materials that may be utilized as a photoresist cross-linking agent include melamine, acetoguanamine, benzoguanamine, urea, ethylene urea, or glycoluril with formaldehyde, glycoluril with a combination of formaldehyde and a lower alcohol, hexamethoxymethylmelamine, bismethoxymethylurea, bismethoxymethylbismethoxyethylene urea, tetramethoxymethylglycoluril, and tetrabutoxymethylglycoluril, mono-, di-, tri-, or tetra-hydroxymethylated glycoluril, mono-, di-, tri-, and/or tetra-methoxymethylated glycoluril, mono-, di-, tri-, and/or tetra-ethoxymethylated glycoluril, mono-, di-, tri-, and/or tetra-propoxymethylated glycoluril, and mono-, di-, tri-, and/or tetra-butoxymethylated glycoluril, 2,3-dihydroxy-5-hydroxymethylnorbornane, 2-hydroy-5,6-bis(hydroxymethyl) norbornane, cyclohexanedimethanol, 3,4,8(or 9)-trihydroxytricyclodecane, 2-methyl-2-adamantanol, 1,4-dioxane-2,3-diol and 1,3,5-trihydroxycyclohexane, tetramethoxymethyl glycoluril, methylpropyltetramethoxymethyl glycoluril, and methylphenyltetramethoxymethylglycoluril, 2,6-bis(hydroxymethyl)p-cresol, N-methoxymethyl- or N-butoxymethyl-melamine. Additionally, compounds obtained by reacting formaldehyde, or formaldehyde and lower alcohols with amino group-containing compounds, such as melamine, acetoguanamine, benzoguanamine, urea, ethylene urea and glycoluril, and substituting the hydrogen atoms of the amino group with hydroxymethyl group or lower alkoxymethyl group, examples being hexamethoxymethylmelamine, bismethoxymethyl urea, bismethoxymethylbismethoxyethylene urea, tetramethoxymethyl glycoluril and tetrabutoxymethyl glycoluril, copolymers of 3-chloro-2-hydroxypropyl methacrylate and methacrylic acid, copolymers of 3-chloro-2-hydroxypropyl methacrylate and cyclohexyl methacrylate and methacrylic acid, copolymers of 3-chloro-2-hydroxypropyl methacrylate and benzyl methacrylate and methacrylic acid, bisphenol A-di(3-chloro-2-hydroxypropyl) ether, poly(3-chloro-2-hydroxypro-pyl)ether of a phenol novolak resin, pentaerythritol tetra(3-chloro-2-hydroxypropyl)ether, trimethylolmethane tri(3-chloro-2-hydroxypropyl)ether phenol, bisphenol A-di(3-acetoxy-2-hydroxypropyl)ether, poly(3-acetoxy-2-hydroxypropyl)ethe- r of a phenol novolak resin, pentaerythritol tetra(3-acetoxy-2-hydroxyprop-yl)ether, pentaerythritol poly(3-chloroacetoxy-2-hydroxypropyl)ether, trimethylolmethane tri(3-acetoxy-2-hydroxypropyl)ether, combinations of these, or the like.

In addition to the photoresist polymer resins, the PACs, the detection additive, the photoresist solvents, and the photoresist cross-linking agents, the photoresist 517 may also include a number of other additives that will assist the photoresist 517 obtain the highest resolution. For example, the photoresist 517 may also include surfactants, quenchers, stabilizers, plasticizers, coloring agents, adhesion additives, surface leveling agents, combinations of these, or the like. Any suitable additives may be utilized.

In an embodiment the photoresist polymer resin, the PACs, the detection additive, along with any desired additives or other agents, are added to the photoresist solvent for application. Once added, the mixture is then mixed in order to achieve an even composition throughout the photoresist 517 in order to ensure that there are no defects caused by an uneven mixing or non-constant composition of the photoresist 517. Once mixed together, the photoresist 517 may either be stored prior to its usage or else used immediately.

In an embodiment, the PACs may be present within the photoresist at a concentration of about 0.5%-weight. Additionally, the detection additive may be present within the photoresist at a concentration of between about 0.01%-weight and about 0.03%-weight, such as about 0.015%-weight. However, any suitable concentrations may be utilized.

Once ready, the photoresist 517 may be utilized by initially applying the photoresist 517 onto the seed layer 518. The photoresist 517 may be applied to the seed layer 518 so that the photoresist 517 coats an upper exposed surface of the seed layer 518, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the photoresist 517 may be applied such that it has a thickness over the surface of the seed layer 518 of between about 10 nm and about 300 nm, such as about 150 nm.

Once the photoresist 517 has been applied, a pre-bake of the photoresist 517 is performed in order to cure and dry the photoresist 517 prior to exposure to finish the application of the photoresist 517. The curing and drying of the photoresist 517 removes the photoresist solvent component while leaving behind the photoresist polymer resin, the PACs, the detection additive, the photoresist cross-linking agents, and the other chosen additives. In an embodiment the pre-bake may be performed at a temperature suitable to evaporate the photoresist solvent, such as between about 40° C. and 150° C., although the precise temperature depends upon the materials chosen for the photoresist 517. The pre-bake is performed for a time sufficient to cure and dry the photoresist 517, such as between about 10 seconds to about 5 minutes, such as about 90 seconds.

Figure 6:
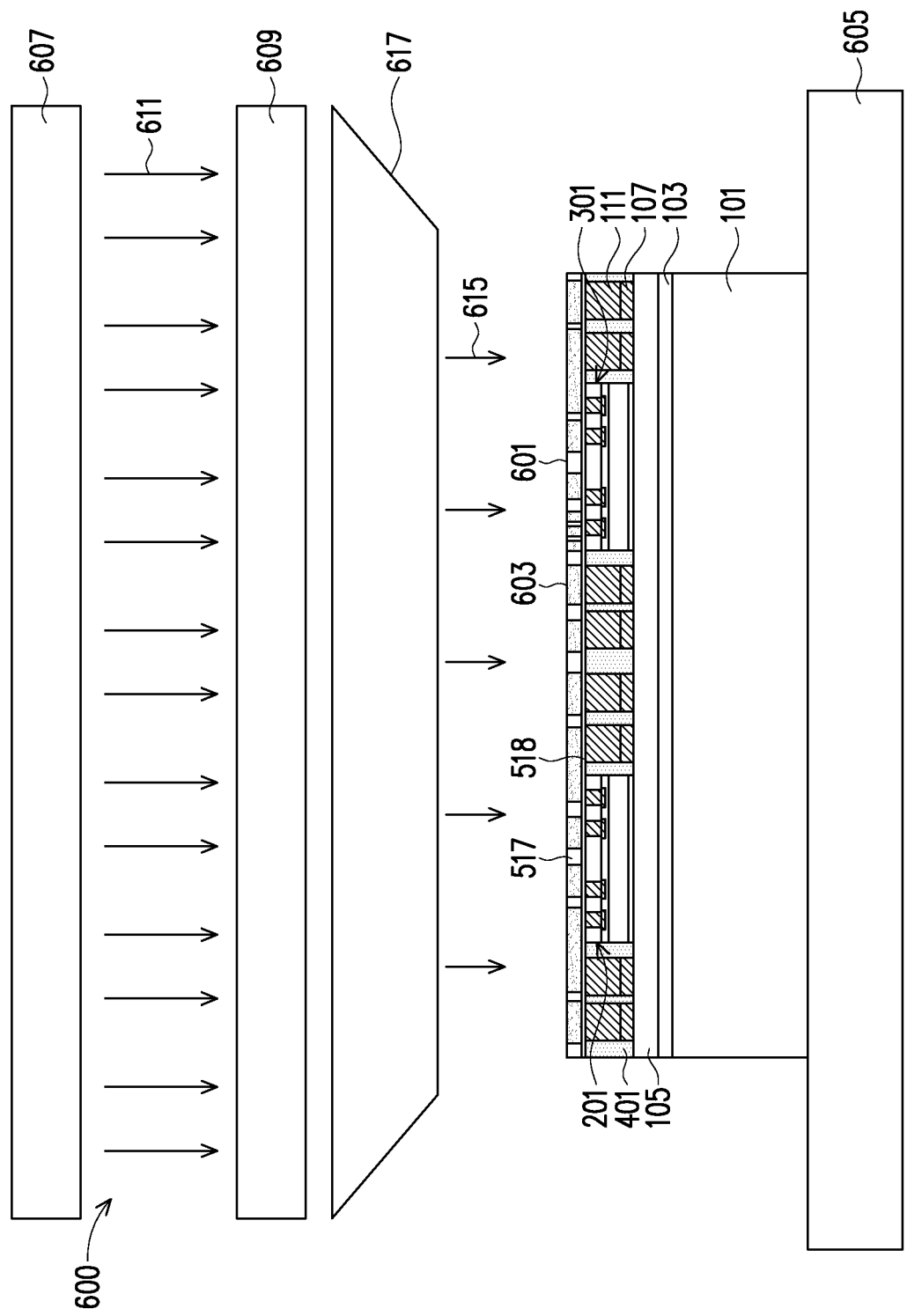
FIG. 6 illustrates an imaging of the photoresist, in accordance with some embodiments.

FIG. 6 illustrates an exposure of the photoresist 517 to form an exposed region 601 and an unexposed region 603 within the photoresist 517. In an embodiment the exposure may be initiated by placing the photoresist 517, once cured and dried, into an imaging device 600 for exposure. The imaging device 600 may comprise a support plate 605, an energy source 607, a patterned mask 609 between the support plate 605 and the energy source 607, and optics 617. In an embodiment the support plate 605 is a surface to which the photoresist 517 may be placed or attached to and which provides support and control to the carrier substrate 101 during exposure of the photoresist 517. Additionally, the support plate 605 may be movable along one or more axes, as well as providing any desired heating or cooling to the carrier substrate 101 and photoresist 517 in order to prevent temperature gradients from affecting the exposure process.

In an embodiment the energy source 607 supplies energy 611 such as light to the photoresist 517 in order to induce a reaction of the PACs, which in turn reacts with the polymer resin to chemically alter those portions of the photoresist 517 to which the energy 611 impinges. In an embodiment the energy 611 may be electromagnetic radiation, such as g-rays (with a wavelength of about 436 nm), i-rays (with a wavelength of about 365 nm), ultraviolet radiation, far ultraviolet radiation, extreme ultraviolet radiation, x-rays, electron beams, or the like. The energy source 607 may be a source of the electromagnetic radiation, and may be a KrF excimer laser light (with a wavelength of 248 nm), an ArF excimer laser light (with a wavelength of 193 nm), a F2 excimer laser light (with a wavelength of 157 nm), or the like, although any other suitable source of energy 611, such as mercury vapor lamps, xenon lamps, carbon arc lamps or the like, may also be utilized.

The patterned mask 609 is located between the energy source 607 and the photoresist 517 in order to block portions of the energy 611 to form a patterned energy 615 prior to the energy 611 actually impinging upon the photoresist 517. In an embodiment the patterned mask 609 may comprise a series of layers (e.g., substrate, absorbance layers, anti-reflective coating layers, shielding layers, etc.) to reflect, absorb, or otherwise block portions of the energy 611 from reaching those portions of the photoresist 517 which are not desired to be illuminated. The desired pattern may be formed in the patterned mask 609 by forming openings through the patterned mask 609 in the desired shape of illumination.

Optics (represented in FIG. 6 by the trapezoid labeled 617) may be used to concentrate, expand, reflect, or otherwise control the energy 611 as it leaves the energy source 607, is patterned by the patterned mask 609, and is directed towards the photoresist 517. In an embodiment the optics 617 comprise one or more lenses, mirrors, filters, combinations of these, or the like to control the energy 611 along its path. Additionally, while the optics 617 are illustrated in FIG. 6 as being between the patterned mask 609 and the photoresist 517, elements of the optics 617 (e.g., individual lenses, mirrors, etc.) may also be located at any location between the energy source 607 (where the energy 611 is generated) and the photoresist 517.

In an embodiment the photoresist 517 is placed on the support plate 605. Once the pattern has been aligned, the energy source 607 generates the desired energy 611 (e.g., light) which passes through the patterned mask 609 and the optics 617 on its way to the photoresist 517. The patterned energy 615 impinging upon portions of the photoresist 517 induces a reaction of the PACs within the photoresist 517. The chemical reaction products of the PACs' absorption of the patterned energy 615 (e.g., acids/bases/free radicals) then react with the polymer resin, chemically altering the photoresist 517 in those portions that were illuminated through the patterned mask 609. However, the detection additive does not participate with the other reactions that occur during the patterning of the photoresist 517.

After the photoresist 517 has been exposed, a post-exposure baking may be used in order to assist in the generating, dispersing, and reacting of the acid/base/free radical generated from the impingement of the patterned energy 615 upon the PACs during the exposure. Such assistance helps to create or enhance chemical reactions which generate chemical differences between the exposed region 601 and the unexposed region 603 within the photoresist 517. These chemical differences also caused differences in the solubility between the exposed region 601 and the unexposed region 603. In an embodiment this post-exposure baking may occur at temperatures of between about 40° C. and about 200° C. for a period of between about 10 seconds and about 10 minutes. However, any suitable temperatures and times may be utilized.

Figure 7:
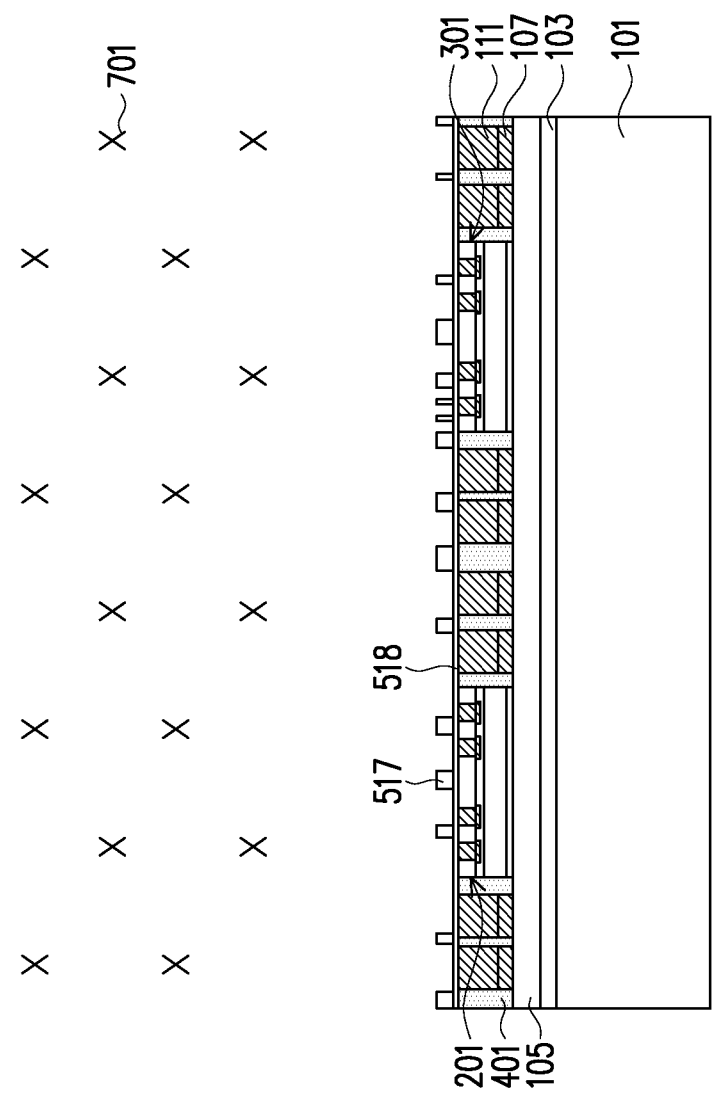
FIG. 7 illustrates a development process, in accordance with some embodiments.

FIG. 7 illustrates a development of the photoresist 517 with the use of a developer 701 after the exposure of the photoresist 517. After the photoresist 517 has been exposed and the post-exposure baking has occurred, the photoresist 517 may be developed using a positive tone developer. In an embodiment the positive tone developer may be a basic aqueous solution that is used to remove those portions of the photoresist 517 which were exposed to the patterned energy 615 and which have had their solubility modified and changed through the chemical reactions. Such basic aqueous solutions may include tetra methyl ammonium hydroxide (TMAH), tetra butyl ammonium hydroxide, sodium hydroxide, potassium hydroxide, sodium carbonate, sodium bicarbonate, sodium silicate, sodium metasilicate, aqueous ammonia, monomethylamine, dimethylamine, trimethylamine, monoethylamine, diethylamine, triethylamine, monoisopropylamine, diisopropylamine, triisopropylamine, monobutylamine, dibutylamine, monoethanolamine, diethanolamine, triethanolamine, dimethylaminoethanol, diethylaminoethanol, ammonia, caustic soda, caustic potash, sodium metasilicate, potassium metasilicate, sodium carbonate, tetraethylammonium hydroxide, combinations of these, or the like.

FIG. 7 illustrates an application of the developer 701 to the photoresist 517 using, e.g., a spin-on process. In this process the developer 701 is applied to the photoresist 517 from above the photoresist 517. In an embodiment the developer 701 may be supplied at a flow rate of between about 10 ml/min and about 2000 ml/min, such as about 1000 ml/min, while the semiconductor device 100 is being rotated at a speed of between about 100 rpm and about 3500 rpm, such as about 1500 rpm. In an embodiment the developer 701 may be at a temperature of between about 10° C. and about 80° C., such as about 50° C., and the development may continue for between about 1 minute to about 60 minutes, such as about 30 minutes.

However, while the spin-on method described herein is one suitable method for developing the photoresist 517 after exposure, it is intended to be illustrative and is not intended to limit the embodiments. Rather, any suitable method for development, including dip processes, puddle processes, spray-on processes, combinations of these, or the like, may be used. All such development processes are fully intended to be included within the scope of the embodiments.

Figure 8:
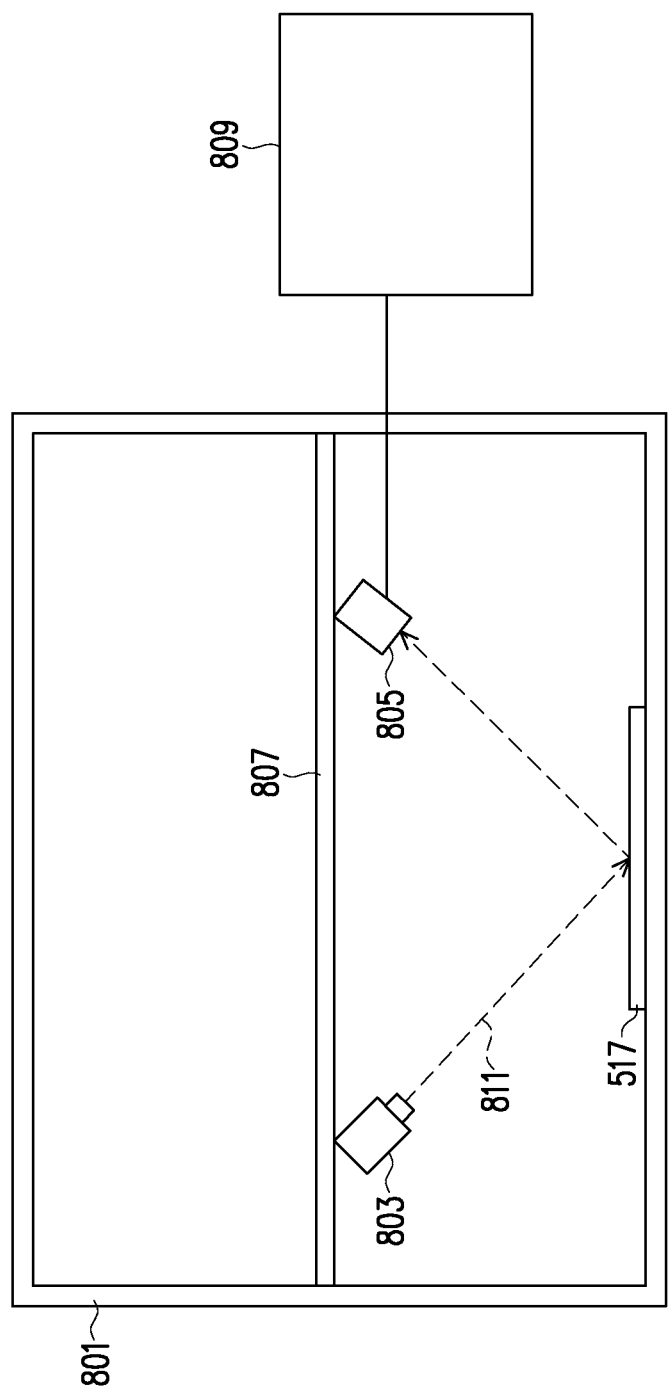
FIG. 8 illustrates an after development inspection process, in accordance with some embodiments.

FIG. 8 illustrates that, after the photoresist 517 has been developed and the developer 701 has been removed, an after development inspection process may be performed in order to determine if there are any defects that have occurred during the placement, patterning, and developing of the photoresist 517. In an embodiment, the photoresist 517 may be placed inside an inspection chamber 801 that also comprises a coherent light source 803 and a camera 805 attached to an optical platform 807. In an embodiment the coherent light source 803 may be one or more sources of an energy that is both reflectable from the photoresist 517 as well as being detectable by the camera 805.

In a particular example, the coherent light source 803 may be a laser that emits a coherent light beam 811 at a wavelength that will, in addition to being suitable for defect inspection, also excite the detection additive. As such, when the coherent light beam 811 impinges upon the photoresist 517 and the detection additive located within the photoresist 517 (described further below), the detection additive (e.g., curcumin) will absorb portions of the coherent light beam 811 at the excitation wavelength and will become excited. When the detection additive subsequently returns to a normal, non-excited state, the detection additive will emit a photon at a different wavelength based upon the emission band of the detection additive (e.g., 540 nm for curcumin). Such excitation and subsequently emission will cause the detection additive to fluoresce, thereby adding the wavelength of the fluorescence to a remainder of the coherent light beam 811 which reflects off of the photoresist 517 and increasing the amount of contrast that can be achieved.

In the particular embodiment in which the detection additive is curcumin, the coherent light beam 811 may be a laser light beam with at least one wavelength that will excite the curcumin, such as at least one wavelength at 420 nm. When the coherent light beam 811 impacts the curcumin, the curcumin will absorb the laser light beam at the 420 nm wavelength and become excited, with at least one electron absorbing the energy and jumping into a higher electron shell. As such, once the curcumin returns to its normal state, the curcumin will emit light at a different wavelength, based on the emission band of the detection additive, which for curcumin is 540 nm.

The camera 805 is utilized to capture the coherent light beam 811 as the coherent light beam 811 reflects off of the surface of the photoresist 517 and is also utilized to capture the light that fluoresces from the detection additive, thereby capturing images of the surface of the photoresist 517 being inspected. In an embodiment the camera 805 may be one or more charge-coupled devices that can detect the energy reflected from the photoresist 517 and the energy fluoresced from the detective additive. Additionally, the camera 805 may also comprise structures such as lenses or other optics which help to separate the incoming reflected laser into different frequencies and directing the different frequencies to different charged coupled devices. Such separation allows for multiples images to be taken simultaneously.

Both the coherent light source 803 and the camera 805 may be attached to the optical platform 807. In an embodiment the optical platform 807 is mounted within the inspection chamber 801 such that the optical platform 807 (and, as such, the coherent light source 803 and the camera 805) is movable with respect to the photoresist 517. In particular, the optical platform 807 may be moved in any direction (up, down, left right, into the page, or out of the page) that may be desired in order to complete a full scan of the photoresist 517.

Additionally, while a number of structures have been described as being part of the inspection chamber 801, the structures that are particularly described are not intended to be limiting to the embodiments. Rather, any number of additional structures, such as diffuse light sources, collimators, polarizers, compensators, focusing lenses, combinations of these, or the like, may also be included as part of the inspection chamber 801. These and all other suitable structures are fully intended to be included within the scope of the embodiments.

In operation, the carrier substrate 101 along with the photoresist 517 (with only the photoresist 517 being illustrated in FIG. 8 for clarity), is placed within the inspection chamber 801 and the optical platform 807 is positioned to a starting position. Once everything is in position, the coherent light source 803 generates the coherent light beam 811 and directs the coherent light beam 811 towards the photoresist 517. The coherent light beam 811 reflects off of the photoresist 517, wherein the topography of the photoresist 517 modifies the reflection, and is captured by the camera 805, where an image of the surface of the photoresist 517 is captured.

However, by utilizing the detection additive, the coherent light beam does not merely reflect off of the surface of the photoresist 517. In addition to reflecting, the coherent light beam will also excite the detection additive that is present within the photoresist 517. When the detection additive returns to its original, non-excited state, the detection additive will emit light and fluoresce a different wavelength of light. This change in wavelength is also picked up by the camera 805, and can be used to help increase the contrast in the image recorded by the camera 805.

The inspection process continues from the initial position by moving the optical platform 807, the photoresist 517, or a combination of both relative to each other by either scanning the photoresist 517 as the optical platform 807 and/or the photoresist 517 move, or else by stopping the illumination, moving the optical platform 807 and/or the photoresist 517, and then illuminating a new section of the photoresist 517. Such scanning or step-and-scan approaches can be continued until all images of the surface of the photoresist 517 that are desired to be inspected have been captured by the camera 805.

Once the camera 805 has captured the desired images (or as the camera 805 captures the desired images), the camera 805 then routes the captured images of the surface of the photoresist 517 to a processing computer 809. The processing computer 809 takes the variously captured images and identifies structures on the surface of the photoresist 517. In one embodiment the processing computer 809 may analyze the image from the camera by calculating Rp/Rs ratios of the reflected coherent light beam 811 and the fluoresced energy from the detection additive for a given wavelength, incident angle, and structure orientation to determine the desired measurements. Such measurements may include pitches between structures, thicknesses of structures, critical dimensions, sidewall angles of structures, combinations of these, or the like of the surface of the photoresist 517.

In a very particular embodiment, the inspection chamber 801 may utilize a Firefly™ series platform from Rudolph Technologies. In this embodiment, a laser may be utilized to scan over the photoresist 517 as well as to excite the detection additive (e.g., curcumin), wherein the reflected laser and the fluoresced energy from the detection additive are then captured and analyzed by a camera. However, while a Firefly™ series platform may be utilized, this is intended to be illustrative only and is not intended to be limiting upon the embodiments, as any suitable platform that can be used along with the detection additive may be utilized.

By utilizing the detection additive along with the inspection process, additional energy in a different wavelength may be obtained from the imaging of the surface of the photoresist 517 during the after development inspection. With the presence of the additional energy, an image with increased contrast may be obtained during the after development inspection process. Such an increase in the contrast of the images, such as an increase of between about 100% and about 300%, helps to identify defects that are not observable without the addition of the detection additive.

Once the after development inspection process has been completed, and if no defects, or a number of defects which may be acceptable, are observed by the after development inspection process, the structure may be sent for further processing (discussed further below). However, if an unacceptable number of defects are observed within the photoresist 517, the photoresist 517 may be removed, through a process such as ashing, and the placement, exposure, development, and inspection of the photoresist 517 may be repeated to ensure that significant defects are not present during later processing.

Figure 9:
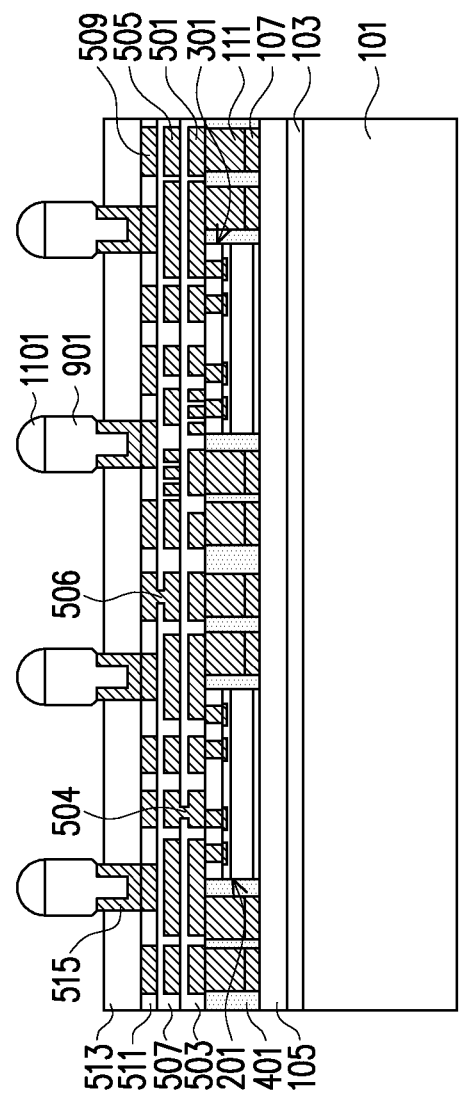
FIG. 9 illustrates formation of a redistribution layer, in accordance with some embodiments.

FIG. 9 illustrates that, once the photoresist 517 has been formed, patterned, and passed inspection, a conductive material, such as copper, may be formed on the seed layer 518 (removed from FIG. 9 for clarity) through a deposition process such as plating (which is not influenced or impacted by the presence of the detection additive) to form the first redistribution layer 501. The conductive material may be formed to have a thickness of between about 1 μm and about 10 μm, such as about 5 μm. However, while the material and methods discussed are suitable to form the conductive material, these materials are merely exemplary. Any other suitable materials, such as AlCu or Au, and any other suitable processes of formation, such as CVD or PVD, may be used to form the first redistribution layer 501.

Once the conductive material has been formed, the photoresist 517 may be removed through a suitable removal process such as ashing. Additionally, after the removal of the photoresist 517, those portions of the seed layer 518 that were covered by the photoresist 517 may be removed through, for example, a suitable etch process using the conductive material as a mask.

Additionally, if desired, an after stripper inspection may be performed in order to ensure that all of the photoresist 517 has been adequately removed before subsequent processing is performed. In an embodiment the after stripper inspection may be performed in a manner similar to the after development inspection, wherein the structure is placed in the inspection chamber 801 and energy (e.g., a laser) is reflected off of the surface and images are captured by a camera 805. In such embodiments the presence of the detection additive will, again, increase the contrast and help identify defects that were not previously detectable. Once the after stripper inspection confirms that the photoresist 517 has been fully removed, the manufacturing process may continue.

FIG. 9 also illustrates a formation of a third passivation layer 503 over the first redistribution layer 501 in order to provide protection and isolation for the first redistribution layer 501 and the other underlying structures. In an embodiment the third passivation layer 503 may be polybenzoxazole (PBO), although any suitable material, such as polyimide or a polyimide derivative, may be utilized. The third passivation layer 503 may be placed using, e.g., a spin-coating process to a thickness of between about 5 μm and about 25 μm, such as about 7 μm, although any suitable method and thickness may be used.

After the third passivation layer 503 has been formed, first openings 504 (only one of which is illustrated in FIG. 9 for clarity) may be made through the third passivation layer 503 by removing portions of the third passivation layer 503 to expose at least a portion of the underlying first redistribution layer 501. The first openings 504 allows for contact between the first redistribution layer 501 and a second redistribution layer 505 (described further below). The first openings 504 may be formed using a suitable photolithographic mask (including, e.g., the inclusion of the detection additive and poste development inspection process) and etching process, although any suitable process to expose portions of first redistribution layer 501 may be used.

The second redistribution layer 505 may be formed to provide additional routing and connectivity and in electrical connection with the first redistribution layer 501. In an embodiment the second redistribution layer 505 may be formed similar to the first redistribution layer 501. For example, a seed layer may be formed, a photoresist with a detection additive may be placed and patterned on top of the seed layer, the photoresist may be inspected, and conductive material may be plated into the patterned openings through the photoresist. Once formed, the photoresist may be removed, the underlying seed layer may be etched, the second redistribution layer 505 may be covered by a fourth passivation layer 507 (which may be similar to the third passivation layer 503), and the fourth passivation layer 507 may be patterned to form second openings 506 (only one of which is illustrated in FIG. 9 for clarity) and expose an underlying conductive portion of the second redistribution layer 505.

The third redistribution layer 509 may be formed to provide additional routing along with electrical connection to the second redistribution layer 505. In an embodiment the third redistribution layer 509 may be formed using materials and processes similar to the first redistribution layer 501. For example, a seed layer may be formed, a photoresist with a detection additive may be placed and patterned on top of the seed layer in a desired pattern for the third redistribution layer 509, the photoresist can be inspected, conductive material is plated into the patterned openings of the photoresist, the photoresist is removed, and the seed layer is etched.

However, in addition to simply rerouting the electrical connections (similar to the second redistribution layer 505), the third redistribution layer 509 may also comprise a landing pad that will be utilized to form an electrical connection to, e.g., an overlying third external connection 901 (described further below). The landing pad may be shaped in order to make suitable physical and electrical connection with the third external connection 901.

Once the third redistribution layer 509 has been formed, the third redistribution layer 509 may be covered by a fifth passivation layer 511. The fifth passivation layer 511, similar to the third passivation layer 503, may be formed from a polymer such as PBO, or may be formed of a similar material as the third passivation layer 503 (e.g., polyimide or a polyimide derivative). The fifth passivation layer 511 may be formed to have a thickness of between about 2 µm and about 15 m, such as about 5 µm.

Once in place over the third redistribution layer 509, the fifth passivation layer 511 may be planarized with the third redistribution layer 509. In an embodiment the planarization may be performed using, e.g., a chemical mechanical polishing process, whereby etchants and abrasives are utilized along with a rotating platen in order to chemically and mechanically remove portions of the fifth passivation layer 511 until the fifth passivation layer 511 is coplanar with the third redistribution layer 509. However, any suitable planarization process, such as a series of one or more etches or a mechanical grinding process, may be utilized.

After the fifth passivation layer 511 has been formed and planarized, a sixth passivation layer 513 may be placed and patterned over the fifth passivation layer 511 and the third redistribution layer 509. In an embodiment the sixth passivation layer 513 may be a similar material as the fifth passivation layer 511 (e.g., PBO) and the sixth passivation layer 513 may be patterned in order to expose an underlying portion of the third redistribution layer 509. In an embodiment the sixth passivation layer 513 may be patterned using a photolithographic masking and etching process, whereby a photoresist is deposited and patterned and then used as a mask during an etching process in order to remove portions of the sixth passivation layer 513 and expose portions of the third redistribution layer 509. However, any suitable method of patterning the sixth passivation layer 513 may be utilized.

After the sixth passivation layer 513 has been formed and patterned, a second seed layer 515 is deposited over the sixth passivation layer 513. In an embodiment the second seed layer 515 is a thin layer of a conductive material that aids in the formation of a thicker layer during subsequent processing steps. The second seed layer 515 may comprise a layer of titanium about 1,000 Å thick followed by a layer of copper about 5,000 Å thick. The second seed layer 515 may be created using processes such as sputtering, evaporation, or PECVD processes, depending upon the desired materials. The second seed layer 515 may be formed to have a thickness of between about 0.3 µm and about 1 µm, such as about 0.5 µm.

Once the second seed layer 515 has been deposited, a photoresist may be placed and patterned over the second seed layer 515 to prepare for a formation of a third external connection 901. In an embodiment the photoresist, with the detection additive added, may be placed and patterned, and then the photoresist may be inspected using an after development inspection process along with the detection additive.

Once the photoresist has been patterned, the third external connection 901 may be formed within the openings of the photoresist. In an embodiment the third external connection 901 may be, for example, a copper pillar and may comprise one or more conductive materials, such as copper, tungsten, other conductive metals, or the like, and may be formed, for example, by electroplating, electroless plating, or the like. In an embodiment, an electroplating process is used wherein the second seed layer 515 and the photoresist are submerged or immersed in an electroplating solution such as a copper sulfate ($CuSO_4$) containing solution. The second seed layer 515 surface is electrically connected to the negative side of an external DC power supply such that the second seed layer 515 functions as the cathode in the electroplating process. A solid conductive anode, such as a copper anode, is also immersed in the solution and is attached to the positive side of the power supply. The atoms from the anode are dissolved into the solution, from which the cathode, e.g., the second seed layer 515, acquires the dissolved atoms, thereby plating the exposed conductive areas of the second seed layer 515 within the opening of the photoresist.

Once the third external connection 901 has been formed using the photoresist and the second seed layer 515, the photoresist may be removed using a suitable removal process. In an embodiment, a plasma ashing process may be used to remove the photoresist, whereby the temperature of the photoresist may be increased until the photoresist experiences a thermal decomposition and may be removed. However, any other suitable process, such as a wet strip, may be utilized. The removal of the photoresist may expose the underlying portions of the second seed layer 515.

FIG. 9 illustrates that, once the second seed layer 515 has been exposed, a removal of the exposed portions of the second seed layer 515 may be performed. In an embodiment the exposed portions of the second seed layer 515 (e.g., those portions that are not covered by the third external connection 901) may be removed by, for example, a wet or dry etching process. For example, in a dry etching process reactants may be directed towards the second seed layer 515 using the third external connection 901 as masks, thereby forming the second seed layer 515 to have a straight sidewall perpendicular with a surface of the sixth passivation layer 513. In another embodiment, etchants may be sprayed or otherwise put into contact with the second seed layer 515 in order to remove the exposed portions of the second seed layer 515.

FIG. 9 illustrates a formation of fourth external connections 1101 on the third external connections 901. In an embodiment the fourth external connections 1101 may be contact bumps such as microbumps or controlled collapse chip connection (C4) bumps and may comprise a material such as tin, or other suitable materials, such as silver or copper. In an embodiment in which the fourth external connections 1101 are contact bumps, the fourth external connections 1101 may comprise a material such as tin, or other suitable materials, such as silver, lead-free tin, or copper. In an embodiment in which the fourth external connection 1101 is a tin solder bump, the fourth external connection 1101 may be formed by initially forming a layer of tin through such commonly used methods such as evaporation, electroplating, printing, solder transfer, ball placement, etc, to a thickness of, e.g., about 100 µm. Once a layer of tin has been formed on the structure, a reflow may be performed in order to shape the material into the desired bump shape which may have a critical dimension of between about 60 µm and about 100 µm, and may be formed in either a round shape or an elliptical shape.

Figure 10:
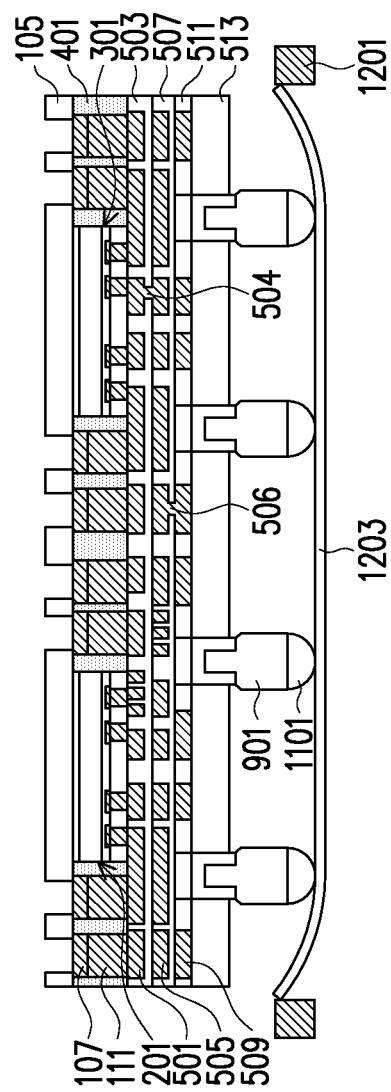
FIG. 10 illustrates a debonding process, in accordance with some embodiments.

FIG. 10 illustrates a debonding of the carrier substrate 101 from the first semiconductor device 201 and the second semiconductor device 301. In an embodiment the fourth external connection 1101 and, hence, the structure including the first semiconductor device 201 and the second semiconductor device 301, may be attached to a ring structure 1201. The ring structure 1201 may be a metal ring intended to provide support and stability for the structure during and after the debonding process. In an embodiment the fourth external connection 1101, the first semiconductor device 201, and the second semiconductor device 301 are attached to the ring structure using, e.g., a ultraviolet tape 1203, although any other suitable adhesive or attachment may be used.

Once the fourth external connection 1101 and, hence, the structure including the first semiconductor device 201 and the second semiconductor device 301 are attached to the ring structure 1201, the carrier substrate 101 may be debonded from the structure including the first semiconductor device 201 and the second semiconductor device 301 using, e.g., a thermal process to alter the adhesive properties of the adhesive layer 103. In a particular embodiment an energy source such as an ultraviolet (UV) laser, a carbon dioxide ($CO_2$) laser, or an infrared (IR) laser, is utilized to irradiate and heat the adhesive layer 103 until the adhesive layer 103 loses at least some of its adhesive properties. Once performed, the carrier substrate 101 and the adhesive layer 103 may be physically separated and removed from the structure comprising the fourth external connection 1101, the first semiconductor device 201, and the second semiconductor device 301.

FIG. 10 additionally illustrates a patterning of the polymer layer 105 in order to expose the vias 111 (along with the associated first seed layer 107). In an embodiment the polymer layer 105 may be patterned using, e.g., a laser drilling method. In such a method a protective layer, such as a light-to-heat conversion (LTHC) layer or a hogomax layer (not separately illustrated in FIG. 10) is first deposited over the polymer layer 105. Once protected, a laser is directed towards those portions of the polymer layer 105 which are desired to be removed in order to expose the underlying vias 111. During the laser drilling process the drill energy may be in a range from 0.1 mJ to about 30 mJ, and a drill angle of about 0 degree (perpendicular to the polymer layer 105) to about 85 degrees to normal of the polymer layer 105. In an embodiment the patterning may be formed to form fourth openings 1205 over the vias 111 to have a width of between about 100 μm and about 300 μm, such as about 200 μm.

In another embodiment, the polymer layer 105 may be patterned by initially applying a photoresist (not individually illustrated in FIG. 10) to the polymer layer 105 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the polymer layer 105 are removed with, e.g., a dry etch process. However, any other suitable method for patterning the polymer layer 105 may be utilized.

Figure 11:
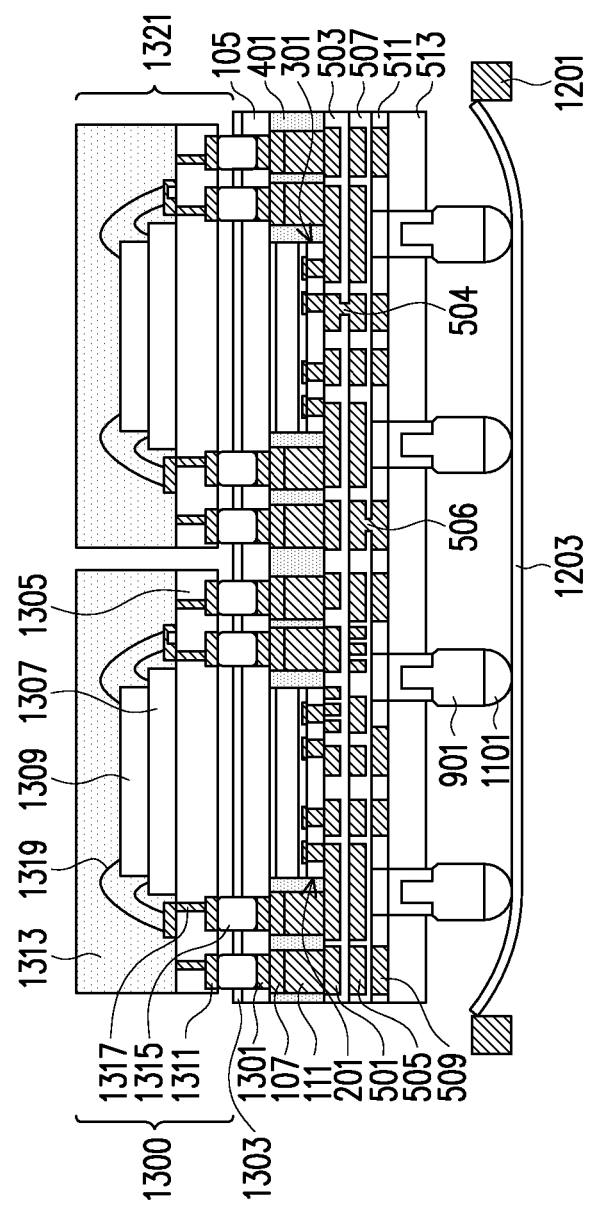
FIG. 11 illustrates placement of a first package, in accordance with some embodiments.

FIG. 11 illustrates a placement of a backside ball pad 1301 within the openings of the polymer layer 105 in order to protect the now exposed vias 111. In an embodiment the backside ball pads 1301 may comprise a conductive material such as solder on paste or an oxygen solder protection (OSP), although any suitable material may be utilized. In an embodiment the backside ball pads 1301 may be applied using a stencil, although any suitable method of application may be utilized, and then reflowed in order to form a bump shape.

FIG. 11 also illustrates a placement and patterning of a backside protection layer 1303 over the backside ball pads 1301, effectively sealing the joint between the backside ball pads 1301 and the vias 111 from intrusion by moisture. In an embodiment the backside protection layer 1303 may be a protective material such as a PBO, Solder Resistance (SR), Lamination Compound (LC) tape, Ajinomoto build-up film (ABF), non-conductive paste (NCP), non-conductive film (NCF), patterned underfill (PUF), warpage improvement adhesive (WIA), liquid molding compound V9, combinations of these, or the like. However, any suitable material may also be used. The backside protection layer 1303 may be applied using a process such as screen printing, lamination, spin coating, or the like, to a thickness of between about 1 μm to about 200 μm.

FIG. 11 also illustrates that, once the backside protection layer 1303 has been placed, the backside protection layer 1303 may be patterned in order to expose the backside ball pads 1301. In an embodiment the backside protection layer 1303 may be patterned using, e.g., a laser drilling method, by which a laser is directed towards those portions of the backside protection layer 1303 which are desired to be removed in order to expose the backside ball pads 1301. During the laser drilling process the drill energy may be in a range from 0.1 mJ to about 30 mJ, and a drill angle of about 0 degree (perpendicular to the backside protection layer 1303) to about 85 degrees to normal of the backside protection layer 1303. In an embodiment the exposure may form openings with a diameter of between about 30 μm and about 300 μm, such as about 150 μm.

In another embodiment, the backside protection layer 1303 may be patterned by initially applying a photoresist (not individually illustrated in FIG. 11) to the backside protection layer 1303 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the backside protection layer 1303 are removed with, e.g., a dry etch process. However, any other suitable method for patterning the backside protection layer 1303 may be utilized.

FIG. 11 also illustrates a bonding of the backside ball pads 1301 to a first package 1300. In an embodiment the first package 1300 may comprise a third substrate 1305, a third semiconductor device 1307, a fourth semiconductor device 1309 (bonded to the third semiconductor device 1307), third contact pads 1311, a second encapsulant 1313, and fifth external connections 1315. In an embodiment the third substrate 1305 may be, e.g., a packaging substrate comprising internal interconnects (e.g., through substrate vias 1317) to connect the third semiconductor device 1307 and the fourth semiconductor device 1309 to the backside ball pads 1301.

In another embodiment, the third substrate 1305 may be an interposer used as an intermediate substrate to connect the third semiconductor device 1307 and the fourth semiconductor device 1309 to the backside ball pads 1301. In this embodiment the third substrate 1305 may be, e.g., a silicon substrate, doped or undoped, or an active layer of a silicon-on-insulator (SOI) substrate. However, the third substrate 1305 may also be a glass substrate, a ceramic substrate, a polymer substrate, or any other substrate that may provide a suitable protection and/or interconnection functionality. These and any other suitable materials may be used for the third substrate 1305.

The third semiconductor device 1307 may be a semiconductor device designed for an intended purpose such as being a logic die, a central processing unit (CPU) die, a memory die (e.g., a DRAM die), combinations of these, or the like. In an embodiment the third semiconductor device 1307 comprises integrated circuit devices, such as transistors, capacitors, inductors, resistors, metallization layers (not shown), and the like, therein, as desired for a particular functionality. In an embodiment the third semiconductor device 1307 is designed and manufactured to work in conjunction with or concurrently with the first semiconductor device 201.

The fourth semiconductor device 1309 may be similar to the third semiconductor device 1307. For example, the fourth semiconductor device 1309 may be a semiconductor device designed for an intended purpose (e.g., a DRAM die) and comprising integrated circuit devices for a desired functionality. In an embodiment the fourth semiconductor device 1309 is designed to work in conjunction with or concurrently with the first semiconductor device 201 and/or the third semiconductor device 1307.

The fourth semiconductor device 1309 may be bonded to the third semiconductor device 1307. In an embodiment the fourth semiconductor device 1309 is only physically bonded with the third semiconductor device 1307, such as by using an adhesive. In this embodiment the fourth semiconductor device 1309 and the third semiconductor device 1307 may be electrically connected to the third substrate 1305 using, e.g., wire bonds 1319, although any suitable electrical bonding may be utilized.

In another embodiment, the fourth semiconductor device 1309 may be bonded to the third semiconductor device 1307 both physically and electrically. In this embodiment the fourth semiconductor device 1309 may comprise external connections (not separately illustrated in FIG. 11) that connect with external connections (also not separately illustrated in FIG. 11) on the third semiconductor device 1307 in order to interconnect the fourth semiconductor device 1309 with the third semiconductor device 1307.

The third contact pads 1311 may be formed on the third substrate 1305 to form electrical connections between the third semiconductor device 1307 and, e.g., the fifth external connections 1315. In an embodiment the third contact pads 1311 may be formed over and in electrical contact with electrical routing (such as through substrate vias 1317) within the third substrate 1305. The third contact pads 1311 may comprise aluminum, but other materials, such as copper, may be used. The third contact pads 1311 may be formed using a deposition process, such as sputtering, to form a layer of material (not shown) and portions of the layer of material may then be removed through a suitable process (such as photolithographic masking and etching) to form the third contact pads 1311. However, any other suitable process may be utilized to form the third contact pads 1311. The third contact pads 1311 may be formed to have a thickness of between about 0.5 µm and about 4 µm, such as about 1.45 µm.

The second encapsulant 1313 may be used to encapsulate and protect the third semiconductor device 1307, the fourth semiconductor device 1309, and the third substrate 1305. In an embodiment the second encapsulant 1313 may be a molding compound and may be placed using a molding device (not illustrated in FIG. 11). For example, the third substrate 1305, the third semiconductor device 1307, and the fourth semiconductor device 1309 may be placed within a cavity of the molding device, and the cavity may be hermetically sealed. The second encapsulant 1313 may be placed within the cavity either before the cavity is hermetically sealed or else may be injected into the cavity through an injection port. In an embodiment the second encapsulant 1313 may be a molding compound resin such as polyimide, PPS, PEEK, PES, a heat resistant crystal resin, combinations of these, or the like.

Once the second encapsulant 1313 has been placed into the cavity such that the second encapsulant 1313 encapsulates the region around the third substrate 1305, the third semiconductor device 1307, and the fourth semiconductor device 1309, the second encapsulant 1313 may be cured in order to harden the second encapsulant 1313 for optimum protection. While the exact curing process is dependent at least in part on the particular material chosen for the second encapsulant 1313, in an embodiment in which molding compound is chosen as the second encapsulant 1313, the curing could occur through a process such as heating the second encapsulant 1313 to between about 100° C. and about 130° C., such as about 125° C. for about 60 sec to about 3000 sec, such as about 600 sec. Additionally, initiators and/or catalysts may be included within the second encapsulant 1313 to better control the curing process.

However, as one having ordinary skill in the art will recognize, the curing process described above is merely an exemplary process and is not meant to limit the current embodiments. Other curing processes, such as irradiation or even allowing the second encapsulant 1313 to harden at ambient temperature, may be used. Any suitable curing process may be used, and all such processes are fully intended to be included within the scope of the embodiments discussed herein.

In an embodiment the fifth external connections 1315 may be formed to provide an external connection between the third substrate 1305 and, e.g., the backside ball pads 1301. The fifth external connections 1315 may be contact bumps such as microbumps or controlled collapse chip connection (C4) bumps and may comprise a material such as tin, or other suitable materials, such as silver or copper. In an embodiment in which the fifth external connections 1315 are tin solder bumps, the fifth external connections 1315 may be formed by initially forming a layer of tin through any suitable method such as evaporation, electroplating, printing, solder transfer, ball placement, etc, to a thickness of, e.g., about 100 µm. Once a layer of tin has been formed on the structure, a reflow is performed in order to shape the material into the desired bump shape.

Once the fifth external connections 1315 have been formed, the fifth external connections 1315 are aligned with and placed into physical contact with the backside ball pads 1301, and a bonding is performed. For example, in an embodiment in which the fifth external connections 1315 are solder bumps, the bonding process may comprise a reflow process whereby the temperature of the fifth external connections 1315 is raised to a point where the fifth external connections 1315 will liquefy and flow, thereby bonding the first package 1300 to the backside ball pads 1301 once the fifth external connections 1315 resolidifies.

FIG. 11 additionally illustrates the bonding of a second package 1321 to the backside ball pads 1301. In an embodiment the second package 1321 may be similar to the first package 1300, and may be bonded to the backside ball pads 1301 utilizing similar processes. However, the second package 1321 may also be different from the first package 1300.

Figure 12:
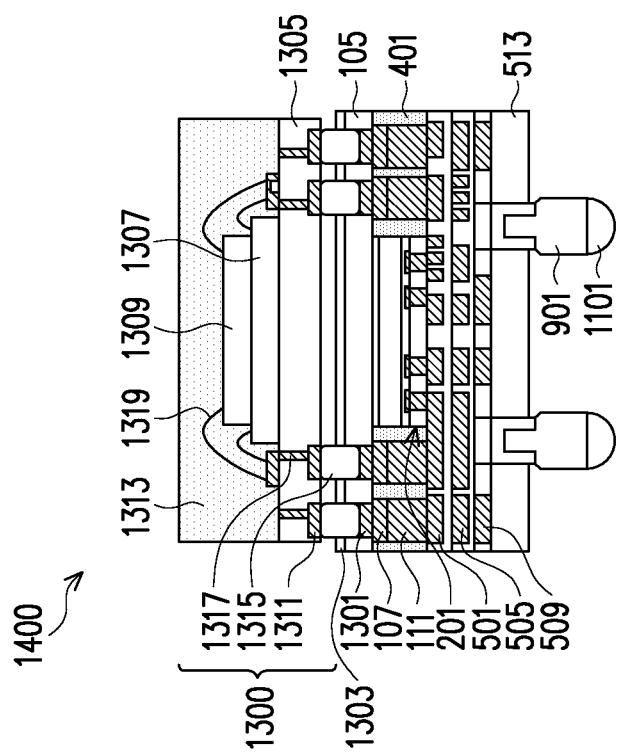
FIG. 12 illustrates a singulation process, in accordance with some embodiments.

FIG. 12 illustrates a debonding of the fourth external connections 1101 from the ring structure 1201 and a singulation of the structure to form a first integrated fan out package-on-package (InFO-POP) structure 1400. In an embodiment the fourth external connections 1101 may be debonded from the ring structure 1201 by initially bonding the first package 1300 and the second package 1321 to a second ring structure using, e.g., a second ultraviolet tape. Once bonded, the ultraviolet tape 1203 may be irradiated with ultraviolet radiation and, once the ultraviolet tape 1203 has lost its adhesiveness, the fourth external connections 1101 may be physically separated from the ring structure 1201.

Once debonded, a singulation of the structure to form the first InFO-POP structure 1400 is performed. In an embodiment the singulation may be performed by using a saw blade (not shown) to slice through the encapsulant 401 and the polymer layer 105 between the vias 111, thereby separating one section from another to form the first InFO-POP structure 1400 with the first semiconductor device 201. However, as one of ordinary skill in the art will recognize, utilizing a saw blade to singulate the first InFO-POP structure 1400 is merely one illustrative embodiment and is not intended to be limiting. Other methods for singulating the first InFO-POP structure 1400, such as utilizing one or more etches to separate the first InFO-POP structure 1400, may also be utilized. These methods and any other suitable methods may be utilized to singulate the first InFO-POP structure 1400.

By utilizing the detection additive (e.g., curcumin) within the photoresist, along with the inspection process, additional energy in a different wavelength may be obtained from the imaging of the surface of the photoresist 517 during and after the development inspection. With the presence of the additional energy, an image with increased contrast may be obtained during the after development inspection process. Such an increase in the contrast of the images, such as an increase of between about 100% and about 300%, helps to identify defects that are not observable without the addition of the detection additive. As such, more defects can be identified and dealt with before the defects can affect subsequent processing steps, leading to an overall increase in efficiency and yield.

In an embodiment, a method of manufacturing a semiconductor device, the method including: applying a photoresist over a semiconductor substrate, the photoresist comprising a detection additive; exposing and developing the photoresist; and inspecting the photoresist after the developing the photoresist, wherein the detection additive fluoresces during the inspecting the photoresist. In an embodiment, the detection additive is curcumin. In an embodiment, the detection additive fluoresces at a wavelength of about 540 nm. In an embodiment, the inspecting the photoresist includes directing a laser at the photoresist. In an embodiment, the detection additive has a concentration within the photoresist of between about 0.01%-weight and about 0.03%-weight. In an embodiment, the detection additive has a concentration within the photoresist of about 0.015%-weight. In an embodiment, the applying the photoresist applies the photoresist over a through insulator via and an encapsulant.

In another embodiment, a includes: placing a photoresist polymer resin into a photoresist solvent; placing a photoacid generator into the photoresist solvent; placing curcumin into the photoresist solvent; and mixing the photoresist polymer resin, the photoacid generator, the curcumin, and the photoresist solvent to form a photoresist. In an embodiment, the method further includes dispensing the photoresist onto a semiconductor substrate. In an embodiment, the method further includes developing the photoresist; and inspecting the photoresist after the developing the photoresist. In an embodiment, during the inspecting the photoresist the curcumin will fluoresce. In an embodiment, an encapsulant surrounds the semiconductor substrate. In an embodiment, through vias extend through the encapsulant. In an embodiment, the method further includes plating a redistribution layer within the photoresist after the inspecting the photoresist.

In yet another embodiment, a photoresist includes: a photoresist polymer resin; a photoactive compound; and a detection additive, wherein the detection additive has a concentration within the photoresist of between about 0.01%-weight and about 0.03%-weight. In an embodiment, the detection additive is curcumin. In an embodiment, the photoresist polymer resin is located over a semiconductor substrate. In an embodiment, the photoresist polymer resin is located over an encapsulant around the semiconductor substrate. In an embodiment, the photoresist polymer resin is located over a through via that extends from a first side of the encapsulant to a second side of the encapsulant. In an embodiment, the photoresist is a positive tone photoresist.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    applying a photoresist over a semiconductor substrate, the photoresist comprising a detection additive, wherein the applying the photoresist applies the photoresist over a through insulator via and an encapsulant;
    exposing and developing the photoresist; and
    inspecting the photoresist after the developing the photoresist, wherein the detection additive fluoresces during the inspecting the photoresist.

2. The method of claim 1, wherein the detection additive is curcumin.

3. The method of claim 1, wherein the detection additive fluoresces at a wavelength of about 540 nm.

4. The method of claim 1, wherein the inspecting the photoresist comprises directing a laser at the photoresist.

5. The method of claim 1, wherein the detection additive has a concentration within the photoresist of between about 0.01%-weight and about 0.03%-weight.

6. The method of claim 5, wherein the detection additive has a concentration within the photoresist of about 0.015%-weight.

7. The method of claim 1, wherein the photoresist is a positive tone photoresist.

8. A method comprising:
placing a photoresist polymer resin into a photoresist solvent;
placing a photoacid generator into the photoresist solvent;
placing curcumin into the photoresist solvent;
mixing the photoresist polymer resin, the photoacid generator, the curcumin, and the photoresist solvent to form a photoresist; and
dispensing the photoresist onto a semiconductor substrate, wherein an encapsulant surrounds the semiconductor substrate.

9. The method of claim 8, further comprising;
developing the photoresist; and
inspecting the photoresist after the developing the photoresist.

10. The method of claim 9, wherein during the inspecting the photoresist the curcumin will fluoresce.

11. The method of claim 8, wherein through vias extend through the encapsulant.

12. The method of claim 11, further comprising plating a redistribution layer within the photoresist after the inspecting the photoresist.

13. The method of claim 8, wherein the curcumin has a concentration of between about 0.01%-weight and about 0.03%-weight.

14. The method of claim 8, wherein the photoresist fluoresces at a wavelength of about 540 nm.

15. A photoresist comprising:
a photoresist polymer resin, wherein the photoresist polymer resin is located over a semiconductor substrate;
a photoactive compound; and
a detection additive, wherein the detection additive has a concentration within the photoresist of between about 0.01%-weight and about 0.03%-weight, wherein the photoresist polymer resin is located over an encapsulant around the semiconductor substrate.

16. The photoresist of claim 15, wherein the detection additive is curcumin.

17. The photoresist of claim 15, wherein the photoresist polymer resin is located over a through via that extends from a first side of the encapsulant to a second side of the encapsulant.

18. The photoresist of claim 15, wherein the photoresist is a positive tone photoresist.

19. The method of claim 15, wherein the detection additive has a concentration with the photoresist of about 0.015%-weight.

20. The method of claim 15, wherein the detection addition fluoresces at a wavelength of about 540 nm.

* * * * *